United States Patent [19]

Oboodi et al.

[11] Patent Number: 4,997,698

[45] Date of Patent: *Mar. 5, 1991

[54] CERAMIC COATED METAL SUBSTRATES FOR ELECTRONIC APPLICATIONS

[75] Inventors: Reza Oboodi, Livingston; Daniel C. Blazej, Annandale, both of N.J.

[73] Assignee: Allied-Signal, Inc., Morris Township, Morris County, N.J.

[*] Notice: The portion of the term of this patent subsequent to Dec. 27, 2005 has been disclaimed.

[21] Appl. No.: 370,930

[22] Filed: Jun. 23, 1989

Related U.S. Application Data

[63] Continuation-in-part of Ser. No. 212,759, Jun. 29, 1988, which is a continuation-in-part of Ser. No. 45,930, May 4, 1987, Pat. No. 4,794,048.

[51] Int. Cl.$^5$ ............................................. B32B 9/00
[52] U.S. Cl. .................................. 428/209; 428/210; 428/212; 428/427; 428/428; 428/433; 428/450; 428/689; 428/697; 428/457; 428/901; 501/7; 501/9; 427/96; 427/287; 427/327; 427/376.4; 427/399
[58] Field of Search ............... 501/7, 9; 428/209, 210, 428/212, 427, 428, 433, 450, 689, 697, 904, 901, 457; 427/96, 287, 327, 376.4, 399

[56] References Cited

U.S. PATENT DOCUMENTS

| | | | |
|---|---|---|---|
| 2,975,078 | 3/1961 | Rayfield | 427/376.4 |
| 4,256,796 | 3/1981 | Hang et al. | |
| 4,358,541 | 11/1982 | Andrus et al. | |
| 4,385,127 | 5/1983 | Chyung | |
| 4,503,128 | 3/1985 | Iseli et al. | 428/446 |
| 4,732,794 | 3/1988 | Hyde | 428/210 |
| 4,794,048 | 12/1988 | Oboodi et al. | 428/432 |

OTHER PUBLICATIONS

"Thick-Film Microelectronics", Van Nostrand Reinhold, N.Y. 1971.
"Handbook of Microelectronics Packaging and Interconnection Technologies", F. N. Sinnadurai, Electrochemicals Publ. Ltd., Great Britian, (1985).
"Ceramic Coated Copper Substrates for Hybrid Circuits", R. Kuzel et al., Hybrid Circuits, 4, pp. 4–9 (1984).
L. S. Onyshkevych et al., "Manufacturing Steps in the Production of Porcelain-Enamel PC Boards", RCA Review, 42, pp. 145–158 (1981).
I. Nobuo et al., "Thick Film Circuit on Bent Porcelain--Bent Substrate", Int. J. Hybrid Microelectron, 5(2), pp. 1–8 (1982).
S. C. Hugh, "Multilayer Thick-Film Circuits on Porcelainized Steel Substrates" Int. J. Hybrid Microelectron, 4(2), pp. 326–330 (1981).
K. W. Hang et al., "Low Expansion Porcelain-Coated Copper-Clad Invar Substrates", RCA Review, 45, pp. 33–48 (1984).
A. N. Prabhu et al., "Optimization of RCS Porcelain for Compatibility with Thick Films", RCA Review, 42, pp. 221–237 (1981).
E. W. Hughes, "Status Report on Porcelain Enameled Metal Substrates", Ceramic Eng. Soc. Proc., 5, pp. 219–220 (1984).
R. B. Schabacker, "The Multiplicity of Variations in PEMS", Appliance, 39(6), pp. 76–79 (1982).
R. L. Schelhorn, "Metal Core Materials for Thick Film Substrate Applications", Int. J. Hybrid Microelectron, 4(2), pp. 347–352 (1981).
K. W. Hang et al., "High Temperature Porcelain Coated Steel Electronic Substrates Composition and Properties", RCA Review, 42, pp. 159–177 (1981).
L. S. Onyshkevych, "Porcelain Enameled Steel Substrates for Electronic Applications", Appliance, 38 (4), pp. 46–49 (1981).
B. H. Mussler et al., "Preparation and Properties of Mullite-Cordierite Composites", Ceramic Bulletin, 63, No. 5, pp. 705–714 (1984).

Primary Examiner—Patrick J. Ryan
Attorney, Agent, or Firm—Ernest D. Buff; Gerhard H. Fuchs

[57] ABSTRACT

The present invention is directed to a ceramic coated metal substrate having improved processibility characteristics in the manufacture of electronic devices, as for example electronic circuits, and to processes for manufacture of such devices.

55 Claims, 2 Drawing Sheets

CERAMIC COATED METAL SUBSTRATES FOR ELECTRONIC APPLICATIONS

CROSS-REFERENCE TO RELATED APPLICATIONS

This application is a Continuation-In-Part of United States Application Ser. No. 212,759 filed June 29, 1988 which, in turn, is a Continuation-in-Part of Ser. No. 095,930, filed May 3, 1987, now U.S. Pat. No. 4,794,048.

BACKGROUND OF THE INVENTION

1. Field of the Invention

This invention relates to ceramic coated metal substrates for use in electronic applications. More particularly, this invention relates to such coated substrates having improved processibility characteristics in the manufacture of electronic devices, as for example electronic circuits.

2. Prior Art

In the manufacture of electronic devices, it is standard to mount or form the various electronic components which comprise the circuits of the devices on a substrate. Various materials have been suggested for use as the substrate. For example, relatively large circuits such as those employed in radios, televisions, computers and the like are generally produced on organic substrates, as for example, reinforced thermosetting resins, reinforced phonolic resins and reinforced epoxy resin laminates.

The organic plastic circuit boards have some advantages. For example, such boards are relatively inexpensive, can be manufactured in almost any desired size with flat smooth surface and have reasonably good physical strength. Such organic plastic circuit boards also display a number of deficiencies which greatly limit their utility. For example, these materials are heat sensitive and cannot be exposed to high temperatures, i.e. temperatures in excess of 400° C. Thus, metal circuitry and the like must be formed on the surface of the board using low temperature deposition. Moreover, organic plastic substrates cannot be used with newer methods of applying circuits to non-conductive substrates which are lower in cost and provide improved reliability and electrical accuracy but which demand firing temperatures in excess of 600° C. Another disadvantage of plastic circuit boards is that resistors, capacitors, and the like must be manufactured as discrete components in separate manufacturing operations, and then individually mounted on the board. In addition to the wide variety of manufacturing processes required to make a low temperature circuit board, the use of discrete components severely limits the packing density which can be achieved.

The disadvantages of plastic circuit boards have led to the development of circuit manufacturing techniques which allow direct formation of components (conductors, resistors, capacitors, and the like) on the surface of the substrate, (see M.L. Topfer, "Thick-Film Microelectronics", Van Nostrand Reinhold, NY 1971, and F.N. Sinnadurai, "Handbook of Microelectronics Packaging and Interconnection Technologies", Electrochemical Publications Limited, Great Britain, 1985). The materials used to form these so called process induced components (PIC) are usually prepared in the form of inks comprising metal or ceramic powders, glass powders, polymer binders, and a liquid carrier which are printed on the substrate and heated to drive off the organic binder and fuse the remaining components to the substrate. The firing temperatures required for this process typically range from 600° C. to 950° C., considerably in excess of the degradation temperatures of any organic plastic circuit board. The components prepared at these high temperatures generally exhibit very good reliability and electrical accuracy in addition to being relatively low in cost.

Other circuit board substrates have been fabricated out of ceramic substrates. A variety of ceramic materials are commercially available for use as high temperature substrates. Most notable is aluminum oxide. Examples of such substrates are described in R. Kuzel et al., "Ceramic-Coated Copper Substrates for Hybrid Circuits", Hybrid Circuits, No. 4, pp. 4–9 (1984). These substrates composed of aluminum oxide have the advantage that they have excellent high temperature resistance and may be fired and refired at high temperatures, for example, temperatures of from 600° C. to 900° C. Substrates formed from aluminum oxide are relatively inexpensive when the wafers are small and of simple shape, and have therefore become something of an industry standard. However, these materials also suffer from several disadvantages. An inherent disadvantage of ceramic substrates is that they are quite fragile. This places a significant size limitation on their use and, often times, special fixturing is required to prevent damage while in use. Another disadvantage of ceramic substrates is that they can be quite difficult and costly to machine. These aspects of ceramics generally limit their use to small, rectangular, single sided circuits which have very high reliability and precision.

Still other circuit boards have been fabricated out of porcelain coated metals such as steel and copper clad Invar. Illustrative of such materials are those described in U.S. Pat. No. 4,256,796; L.S. Onyshkevych, et al., "Manufacturing Steps in the Production of Porcelain-Enamel PC Boards", RCA Review, Vol. 42, pp. 145-158 (1981); I. Nobuo, et al., "Thick Film Circuit on Bent Porcelain-Bent Substrate", Int. J. Hybrid Microelectron., 5(2), pp. 1 to 8 (1982);; S. C. Hugh, "Multilayer Thick-Film Circuits on Porcelainized Steel Substrates", Int. J. Hybrid Microelectron., 4(2), pp. 326-330 (1981); K. W. Hang, et al., "Low Expansion Porcelain-Coated Copper-Clad Invar Substrates", RCA Review, Vol. 45, pp. 33-48 (1984); A. N. Prabhu, et al., "Optimization of RCA Porcelain for Compatibility With Thick Films", RCA Review, Vol. 42, pp. 221-237 (1981); E. W. Hughes, "Status Report on Porcelain Enameled Metal Substrates", Ceramic Eng. Soc. Proc. 5, p. 219-220 (1984); R. B. Schabacker, "The Multiplicity of Variations in PEMS", Appliance, 39(6), pp. 76-79 (1982); R. L. Schelhorn, "Metal Core Materials for Thick Film Substrate Applications", Int. J. Hybrid Microelectron., 4(2), pp. 347-352 (1981); K. W. Hang, et al., "High-Temperature Porcelain-Coated Steel Electronic Substrates-Composition and Properties", RCA Review, Vol. 42, pp. 159-177 (1981); and L. S. Onyshkevych, "Porcelain-Enameled Steel Substrates for Electronic Applications", Appliance, 38 (4), pp. 46-49 (1981). Although these boards are not subject to thermal degradation as the organic plastic boards, and are substantially stronger than ceramic, they do suffer from certain process and use deficiencies. For example, when low temperature porcelains are fired to the metal they melt and flow in such a way that a meniscus is formed at all edges. It therefore becomes very difficult to print circuitry over the resulting uneven surface. A further problem with low temperature porcelains is that they soften and reflow at about 600° C. which can lead to distortion of the overlying circuitry. Another problem with porcelains is poor adhesion to the metal substrate during use because of substantial differences between the coefficients of thermal expansion of the porcelain and the metal substrate.

Several attempts have been made to obviate the deficiencies of the porcelain-coated substrates. For example, U.S. Pat. No. 4,256,796 discloses the fabrication of porcelain-coated metal circuit boards wherein the porcelain is a devitrified glass, and U.S. Pat. Nos. 4,358,541 and 4,385,127 describe essentially alkali metal free glass-ceramic coatings for use in the manufacture of circuit boards. While relatively effective, these boards also suffer from several disadvantages. For example, the thermal coefficients of expansion (TCE) of the glass or devitrified glass when matched to the TCE of the metal core results in a substrate with TCE's which are not a good match for TCE's of surface mounted components. For example, in the case of partially devitrified glass, the resultant fired coatings have deformation temperatures greater than 700° C. and thermal coefficients of expansion values greater than 11 ppm/° C. Although the high TCE is considered an advantage for adhesion to the metal core, it is a disadvantage when considering a good match to the surface mounted components (typically alumina or silicon) which have TCEs in the 6 to 8 ppm/C range.

Ceramics containing aluminum oxide, silicon oxide and magnesium oxide are known. For example, cordierite-based glass ceramic materials are described in B. H. Mussler, and M. W. Shafer, "Preparation and Properties of Mullite-Cordierite Composites.", *Ceramic Bulletin,* Vol. 63, No. 5, pp. 705–714 (1984), and references cited therein. As noted in *Ceramic Bulletin,* when compared to alumina, presently the most commonly used material, cordierite ($2MgO-2Al_2O_3-5SiO_2$) offers lower dielectric constant and thermal expansion, but has the disadvantage of inferior mechanical properties. Because of the low thermal expansion and inferior mechanical properties of cordierite, it would be expected that the fabrication of electronic devices composed of metal substrates which have relatively high thermal coefficients of expansion coated with cordierite or cordierite based glass ceramic which have relatively low thermal coefficients of expansion would not be feasible because of the large differences in thermal coefficients of expansion.

SUMMARY OF THE INVENTION

This invention relates to a ceramic coated article, having a metal core and having on at least a portion of the surface of the metal core a coating of a glass ceramic, based on its oxide content and on the total weight of the coating, comprising:

(a) from about 8 to about 26% by weight of magnesium oxide (MgO);

(b) from about 10 to about 49% by weight of aluminum oxide ($Al_2O_3$) and;

(c) from about 42 to about 68% by weight of silicon oxide ($SiO_2$).

Several advantages flow from the invention. For example, the ceramic/glasses used in this invention have a high temperature refiring capability (850° C.), and are air firable. Moreover, the article of this invention exhibits a composite thermal coefficient of expansion which is optimum for use in electronic devices, and exhibits a low dielective constant which allows for use with high frequency circuits and allows for greater applicability in electronic application. Furthermore, the ceramic/glasses used in this invention exhibit strong adhesion to the metal substrate after firing and are very resistant to thermal stress. This avoids breakdown of the devices formed from the article of this invention when such articles are exposed to high temperatures normally encountered in the operation of electronic devices. This resistance to thermal stress is indeed surprising in view of the relatively large difference in the thermal coefficient of expansion of the metal substrate and the ceramic glass, and the prior teachings that the metal and coating coefficients of expansion must be matched to produce good adhesion.

Lastly, the combination of relatively low TCE coating (TCE usually less than about 4 ppm/° C.) with the relatively high TCE metal (TCE usually 10 ppm/° C.) produces a composite coated substrate having a TCE within the preferred range (usually from about 6 to about 8 ppm/° C.) which allows for a good TCE match between the substrate and surface mounted components which are usually alumina or silicon having TCE's in the range of from 6 to 8 ppm/° C.

Yet another aspect of this invention comprises a process for manufacturing a glass/ceramic coated article having a metal core and having on at least a portion of the surface of the metal core a coating of a glass ceramic, said process comprising:

(a) heating a metal substrate in the presence of oxygen at a first temperature for a time sufficient to form any amount of an oxide layer on the surfaces of said substrate;

(b) applying to all or a portion of the surfaces of said substrate a suspension comprising one or more organic solvents, one or more heat degradable polymeric binders and a calcined mixture of finely divided non-conductive materials comprising (i) from about 8 to about 26% by weight of MgO;

(ii) from about 10 to about 49% by weight of $Al_2O_3$ and (iii) from about 42 to about 68% by weight of $SiO_2$;

(c) heating the coated/metal substrate combination of step (b) at a second temperature for a time sufficient to remove substantially all of said solvents from the applied suspension;

(d) heating said coated/metal substrate combination of step (c) at a third temperature for a time sufficient to degrade substantially all of said binders in said applied suspension;

(e) heating the coated/metal substrate combination of step (d) at a fourth temperature for a time sufficient to sinter said non-conductive material to form a device comprising a metal substrate having a predetermined pattern of glass/ceramic material bonded to one or more surfaces thereof, said material comprising (on an oxide basis):

(i) from about 8 to about 26% by weight of MgO;

(ii) from about 10 to about 49% by weight of $Al_2O_3$; and (iii) from about 42 to about 68% by weight of $SiO_2$.

(f) heat treating said device at a fifth temperature for a time sufficient to recrystallize any residual glass contained in said material to any extent.

The process of this invention provides for greater selectivity in the application of the glass/ceramic materials to specific sites on a substrate which provides for greater freedom in the manufacture of devices. After processing in accordance with this invention, the coating contains crystallized glass/ceramic which is strongly adherent to the metal core and is suitable as a substrate for processed induced components.

BRIEF DESCRIPTION OF THE DRAWINGS

Referring to the drawings.

DESCRIPTION OF THE PREFERRED EMBODIMENTS

Figure 1:
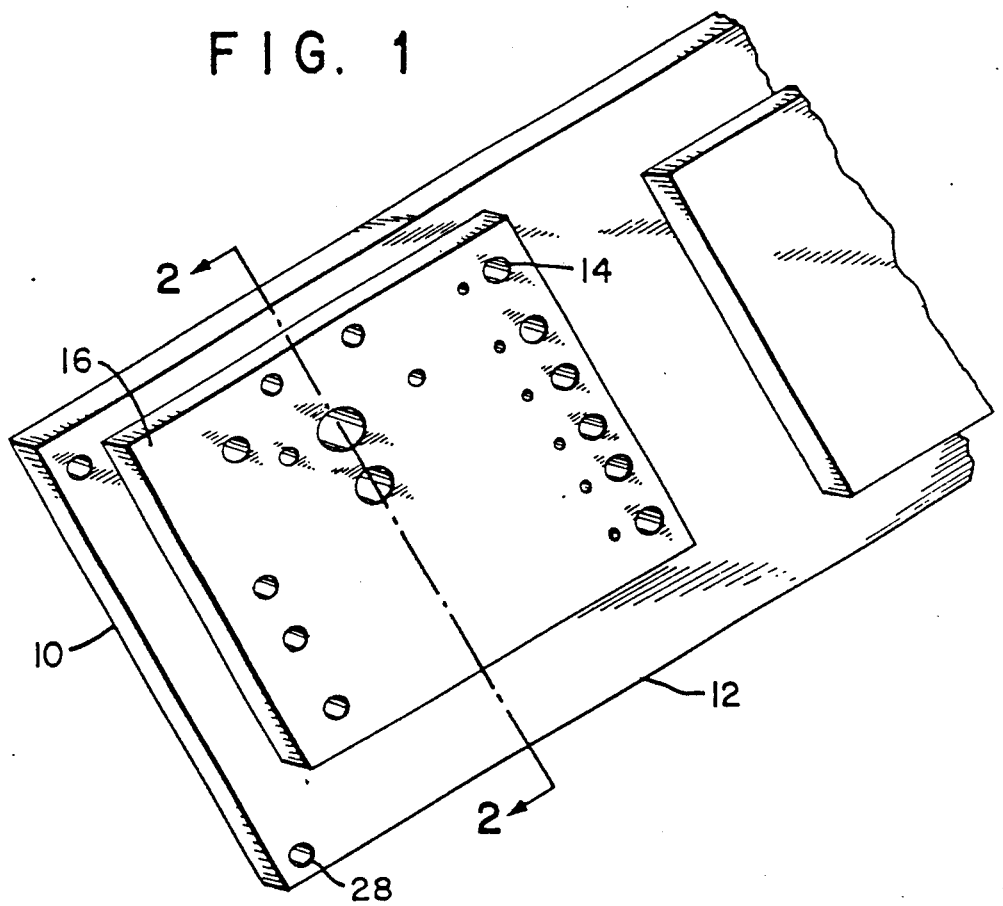
FIG. 1 is a perspective view of an embodiment of the ceramic coated substrate of this invention.
Figure 2:
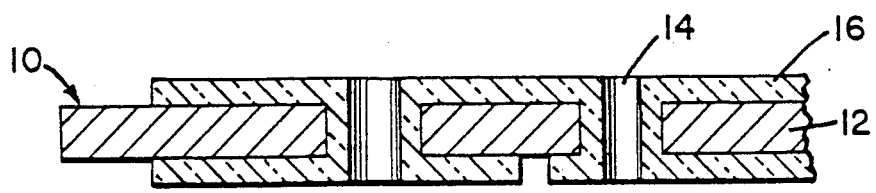
FIG. 2 is an enlarged latitudinal sectional view of the substrate of FIG. 1 taken along line 2—2.

Referring to FIGS. 1 and 2, a coated metal substrate in accordance with the present invention is indicated at 10. Substrate 10 includes a metal layer 12 having a number of through holes 14 for receipt of interconnecting devices for providing electrical connection between device 20 formed from substrate 10 and other electronic devices; substrate 10 also includes holes 28 for connecting the substrate to supporting structure (not depicted), and a non-conductive layer 16 composed of the ceramic glass of this invention heat bonded to selective portions of the top and/or bottom surfaces of metal substrate 12. In the preferred embodiments of the invention depicted to FIGS. 1 and 2, metal layer 12 consists of an elongated solid metal strip. Metal layer 12 is composed of a metal such as alloys based on nickel and iron which resist oxidation when heated at high temperature in the presence of oxygen. Preferred for use in the practice of this invention are metals which can be exposed to temperatures in excess of about 1100° C. in an oxidizing atmosphere without excessive spalling and which have thermal coefficients of expansion 10 ppm/° C., and preferably 12 ppm/° C. over the temperature range of from about 50° C. to about 250° C. Illustrative of such preferred alloys are those alloys based on cobalt, nickel, and iron and which optionally include aluminum and which preferably also include chromium. Particularly preferred metals for use in the construction of metal layer 12 are nickel based alloys as for example, the nickel alloy HAYNES alloy No. 214 available from Haynes Corporation and the iron based alloys, as for example, the iron based alloys Alfa-IV and Fecralloy available from Allegheny Ludlum Steel Corporation.

In general, the thickness of layer 12 is at least about 0.25 mm, and typically will vary from about 0.25 mm to about 25 mm. In the preferred embodiments of the invention, layer 12 is from about 0.35 mm to about 10 mm in thickness and in the particularly preferred embodiments is from about 0.5 mm to about 5 mm in thickness. Amongst these particularly preferred embodiments, most preferred are those embodiments in which the thickness of layer 12 is from about 1 mm to about 2.5 mm.

In an alternate embodiment of the invention, metal layer 12 is a composite structure. Outer layers of the composite structure are composed of materials previously described for layer 12 and the inner layer is composed of a metal having thermal conductivity greater than that the outer layers. The inner layer is preferably a pure metal which can be exposed to temperatures in excess of 1100° C. Illustrative of such metals are iron, chromium, cobalt, nickel, molybdeum tungsten, and beryllium. Pure nickel exhibits good thermal conductivity, processing and cost characteristics, and is especially preferred.

The composite structure of the core provides enhanced heat spreading properties, making the substrate better suited for packaging high powered electronic devices.

In constructing the core it is preferable to make the inner layer at least one order of magnitude thicker than the outer layers. Typically, each of the outer layers have thickness ranging from 0.025 mm to 0.25 mm. The thickness of the inner layer typically ranges from about 0.5 mm to 25 mm. Use of the outer layers provide a material adapted for bonding to the non-conductive layer, while the inner layer provides the core with enhanced thermal conductivity.

Non-conductive layer 16 is bonded selectively to the bottom and top surfaces of metal substrate 12 to provide the desired effect. In this invention, layer 16 is composed of a ceramic/glass composition. In general, based on the total weight of the coating of (a) from about 8 to about 26% by weight of MgO; (b) from about 10 to about 49% by weight of $Al_2O_3$; and (c) from about 42 to about 68% by weight of $SiO_2$. In the preferred embodiments of the invention, useful ceramic-glass coatings will include on an oxide basis (a) from about 9 to about 22% by weight of MgO; (b) from about 16 to about 45% by weight of $Al_2O_3$; and (c) from about 43 to about 63% by weight of $SiO_2$. In the particularly preferred embodiments of the invention, useful ceramic-glass coating will include on an oxide basis (a) from about 10 to about 18% by weight of MgO; (b) from about 23 to about 40% by weight of $Al_2O_3$; and (c) from about 44 to about 58% by weight of $SiO_2$. Amongst these particularly preferred embodiments of the invention, most preferred are those embodiments in which useful ceramic-glass coatings include (a) from about 12 to about 14% by weight of MgO; (b) from about 30 to about 35% by weight of $Al_2O_3$; and (c) from about 45 to about 52% by weight of $SiO_2$.

The glass/ceramic for use in this invention may be any one of the glass/ceramics based on ternary metal oxide systems containing varying amounts of the three components, MgO, $SiO_2$ and $Al_2O_3$. Illustrative of useful ternary metal oxide systems are cordierite ($2MgO-2Al_2O_3-5SiO_2$), sapphirine ($4MgO-5Al_2O_3-2SiO_2$) and the like. In the preferred embodiments of the invention, the glass/ceramic coating will contain varying amounts of cordierite ($2MgO-Al_2O_3-5SiO_2$) but in addition may include sapphirine ($4MgO-5Al_2O_3-2SiO_2$).

In the preferred embodiments of this the ceramic coating also includes (on an oxide basis) boron oxide and one more alkali metal or alkaline earth metal oxide, preferably an alkali earth metal oxide such as $Li_2O$, $Na_2O$ and $K_2O$ and more preferable $Li_2O$. These preferred oxide components are derived from "fluxing and sintering agents" added to the glass/ceramic during its manufacture. In the preferred embodiments of the invention, the amount of alkali metal or alkaline earth metal oxides is from about 1 to about 4 weight percent based on the total weight of $Al_2O_3$, MgO and $SiO_2$ in the composition and the amount of boron oxide is from about 3 to about 13 weight percent on the aforementioned basis. In the particularly preferred embodiments of the invention, the amount of the alkali metal or alkaline earth metal oxides is from about 1 to about 3 weight percent, and the amount of boron oxide is from about 4 to about 10 weight percent. Amongst these particularly preferred embodiments, most preferred are those embodiments in which the amount of alkali metal or alkaline earth metal oxide is from about 2 to about 3 weight percent, the amount of boron oxide is from about 5 to about 7 weight percent the amount of zinc oxide is from about 1 to about 10 weight percent.

The glass/ceramic coating may also optionally include from 0 to 11% by weight based on the total weight of $Al_2O_3$, MgO and $SiO_2$ in the composition of one or more oxides which function as nucleating agents. Illustrative of such agents are transition metal and transition earth metal oxides, such as $TiO_2$, $ZrO_2$, $Y_2O_3$, $Ta_2O_5$, $La_2O_3$ and the like. Preferred nucleating agents are $TiO_2$ and $ZrO_2$, and the most preferred nucleating agent is $TiO_2$. In the preferred embodiments of the invention, the amount of the nucleating agent is from about 2 to about 8 weight percent, based on the total weight of MgO, $Al_2O_3$ and $SiO_2$ in the composition, and in the particularly preferred embodiments of the invention, the amount of the nucleating agents is from about 4 to about 6 weight percent on the aforementioned basis.

An especially preferred coating contains cordierite ($2MgO-2Al_2O_3-5SiO_2$) and spodumene ($Li_2O-Al_2O_3-4SiO_2$), and optionally $TiO_2$ and/or sapphirine ($4MgO-5Al_2O_3-2SiO_2$). These coatings are characterized as having thermal coefficients of expansion of from about 1.9 to about 2.5 ppm/° C. over a temperature range of from about 50° C. to about 250° C.

The thickness of non-conductive layer 16 can vary widely. In general, layer 16 is from about 0.020mm to about 0.100mm in thickness. In the preferred embodiments of this invention, the thickness of layer 16 is from about 0.025mm to about 0.085mm, and in the particularly preferred embodiments is from about 0.030mm to about 0.070mm. Amongst these particularly preferred embodiments of the invention, the thickness of layer 16 is from about 0.040mm to about 0.060mm.

Figure 3:
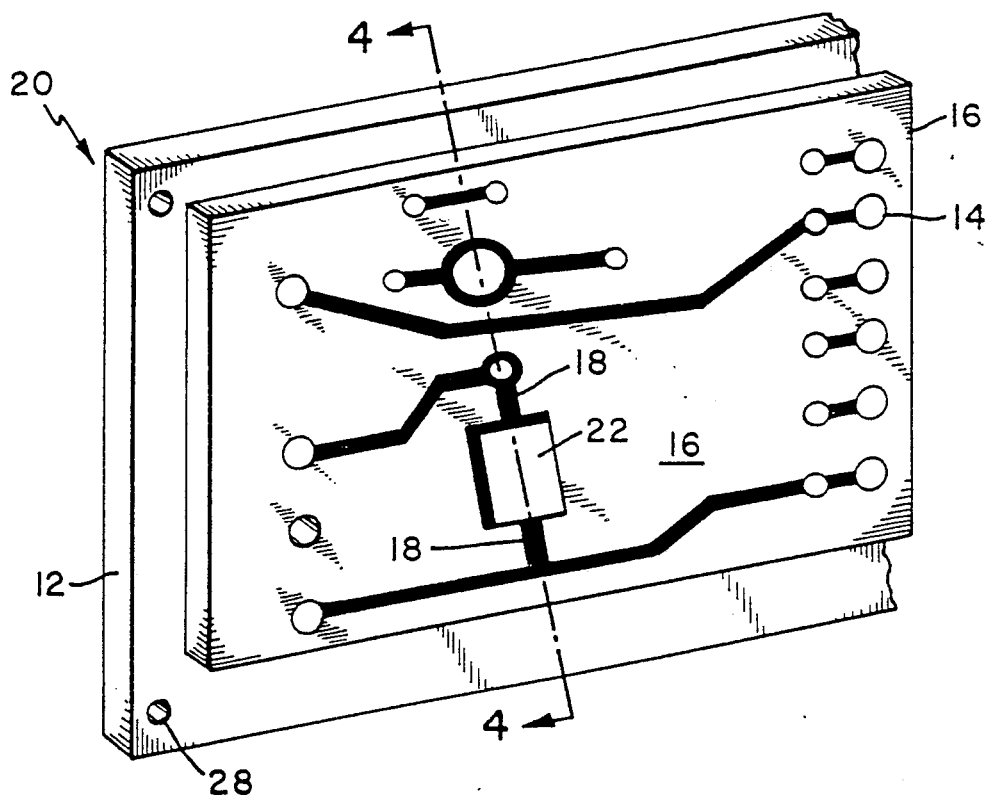
FIG. 3 is a perspective view of an embodiment of the ceramic coated substrate of this invention having an electrical circuit on the surface thereof.
Figure 4:
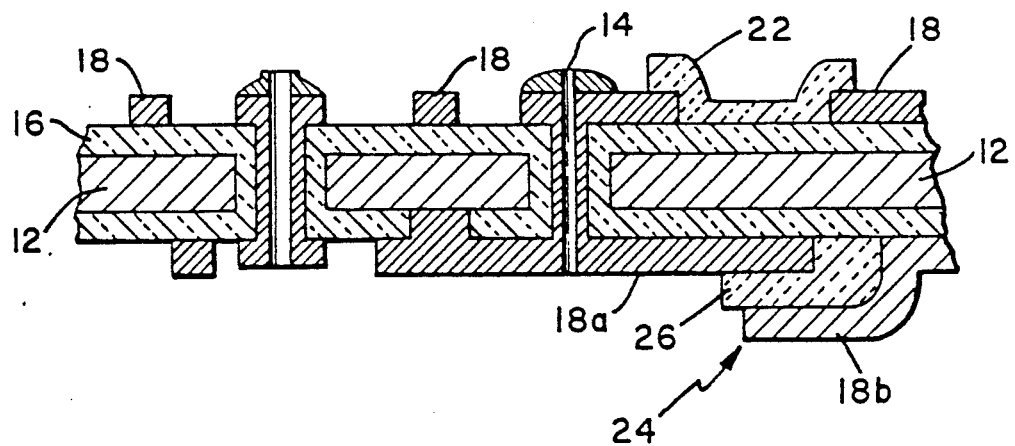
FIG. 4 is an enlarged latitudinal sectional view of the substrate of FIG. 3 taken along line 4—4.

As depicted in electronic device of 20 FIG. 3 and FIG. 4, a conductive circuit pattern 18 which is optionally applied selectively to the top and bottom of surfaces of layer 16 in such a manner to obtain the desired electronic effect. In the preferred embodiments of this invention as depicted in these Figures, conductive layer 18 consists of finely divided metal which has been sintered and heat bonded to the surface of non-conductive layer 16, in a desired circuit pattern. The type of metal which can be used in the construction of pattern 18 can vary widely, and can be any type of metal normally used in the formation of electrical circuits. Illustrative of useful metals are copper, nickel, palladium, platinum, silver, aluminum, gold and the like, and alloys thereof. Thickness of pattern 18 can vary widely. Usually layer 18 has a thickness of from about 0.005 to about 0.075mm. In the preferred embodiments of the invention, the thickness of layer 18 is from about 0.01 to about 0.06mm, and in the particularly preferred embodiments is from about 0.015 to about 0.05mm. Amongst these particularly preferred embodiments, most preferred are those embodiments in which the thickness of layer 18 is from about 0.02 to about 0.03mm.

Various other components are included in the electronic device 20 depicted in FIG. 4. For example, the device includes a resistor 22 bonded to the surface of non-conductive layer 16 between two conductive paths 18. Resistor 22 can be composed of any material commonly used to form resistors, or for example, ruthenium oxide. The electronic device of FIG. 4 also includes a capacity element 24, which is a sandwich structure comprising overlapping conductive patterns 18(a) and 18(b) bonded to and sandwiching a layer 26 which is composed of finely divided dielectric material such as one or more ferroelectric materials, for example, barium titanate, lead magnesium niobate, strontium titanate, lead titanate, calcium titanate, calcium stannate, lead magnesium tungstate, barium potassium titanium niobate, calcium zirconte and sodium tantslate, either alone or in combination with one or more glasses such as silicate, borate and germanate glasses capacity element 24 can be formed by heat sintering and bonding finely divided materials very substantially the same techniques used to form layer 16 and conductive pattern 18 discussed below.

The ceramic coated substrate and the electronic circuit of this invention can be manufactured through use of the process of this invention. In the first step of the process of this invention, if required, metal substrate 12 of a desired configuration is treated to remove burrs, sharp edges, and the like to facilitate later coating with the ceramic. In the preferred embodiments of the invention, the metal substrate 12 is cleaned and degreased to remove foreign materials from the surface of substrate 12. Often metal substrates contain surface inhomogeneties which manifest themselves as pits in subsequent process steps. In the preferred embodiments of the invention, the metal surface is treated to remove such surface inhomogeneties. Amongst the several techniques available for accomplishing this task, preferred are polishing, for example with sand paper, chemical etching, sand blasting and glass bead blasting. Metal substrate 12 is then heated in the presence of an oxidizing atmosphere, preferably air, at a first temperature for a time sufficient to form an amount of a metal oxide layer on one or more surfaces of said layer. The heat treatment of the metal is critical for the formation of an adherent oxide layer which forms a bonding interface for the deposited ceramic coating. The oxide layer so formed is preferably substantially homogeneous in order to prevent localized pitting or spalling. The temperature employed and the duration of the heating step will vary widely depending on the type of metal. In the preferred embodiments of the invention, metal substrate 12 is heated at a temperature of from about 800° C. to about 1250° C. for a period of from ½ to about 24 hours, and in the particularly preferred embodiments, the metal substrate is heated at a temperature of from about 1060° C. to about 1200° C. for a period of from about 1 to about 12 hours. Amongst these particularly preferred embodiments of the invention, most preferred are those embodiments in which the metal substrate is heated to a temperature of from about 1150° C. to about 1200° C. for a period of 4 to about 8 hours.

The method employed for heating metal substrate 12 is not critical and any conventional method can be used. For example, one convenient method is to heat the metal substrate at an appropriate temperature for an appropriate period of time in a box furnace which allows some air to pass in and out.

In the second step of the process of this invention, a suspension comprising one or more organic solvents, one or more heat degradable polymeric binders and a calcined mixture of finely divided glass/ceramic comprising (on an oxide basis):

from about 8 to about 26% by weight of MgO;
from about 10 to about 49% by weight of $Al_2O_3$; and
from about 42 to about 68% by weight of $SiO_2$,
is applied to one or more surfaces of a metal. The types of non-conductive materials employed in the practice of this invention are as described above. The non-conductive materials are used in the form of finely divided particles. In the preferred embodiments of the invention, the materials are in the form of finely divided spherical or substantially spherical particles having an average diameter of not more than about 10 micrometers, and in the particularly preferred embodiments such materials are in the form of finely divided spherical or substantially spherical particles having an average diameter of less than about 5 micrometers. Amongst these particularly preferred embodiments most preferred are those embodiments in which non-conductive materials are in the form of finely divided spherical or substantially spherical particles in which the average particle diameter is less than about 2 micrometers.

"Thermally degradable polymeric organic binders" are one component of the suspension which is applied to the substrate in step two. As used herein "thermally degradable polymeric organic binders" are naturally occurring or synthetic polymers which degrade when subjected to heat. Useful thermally degradable polymeric organic binders for use in this invention are also not critical and can also vary widely. Organic polymer binders for use in the practice of this invention preferably are capable of providing a stable colloidal suspension with the one or more non-conducting materials and one or more organic solvents, and is preferably thermally degradable when heated at temperature of at least about 300° C., and most preferably at a temperature from about 300° C. to about 600° C. to leave a substantially uniform packed coating of the finely divided non-conductive material bonded to one or more surfaces of the metal. Polymers which do not substantially completely thermally degrade or which leave decomposition products which interfere with the insulating capability of the dielectric are not preferred for use. In general, any naturally occurring or synthetic polymeric or elastomeric material can be used. Illustrative of such useful polymers are unsaturated olefins such as polyvinyl alcohol, polyacrylates, polypropylene, polymethacrylates, polyvinyl chloride, polyethylene, and the like; polyethers; polyesters such as polyethylene terephthalate, polybutylene terephthalate and the like; polyamides such as nylon-11, nylon-12, nylon-6, nylon-66 and the like; polysulfones; polyphenylene oxides; cellulose based polymers, such as methyl cellulose ethers, ethylpropyl cellulose ethers and hydroxypropyl cellulose ethers; and the like.

Another component of the suspension applied to the substrate in step two is one or more organic solvents. Organic solvents used to form the suspensions are not critical, and can vary widely. The only requirement is that the solvents are capable of dissolving the thermally degradable polymeric organic binders and capable of dispersing the one or more finely divided non-conductive materials so as to form a colloidal suspension or dispersion. In the preferred embodiments of the invention, organic solvents are those which volatilize when heated to a temperature of from about 50° C. to about 250° C. at atmospheric pressure, and in the particularly preferred embodiments organic solvents are those which volatilize when heated to a temperature of from about 75° C. to about 150° C. at atmospheric pressure.

Amongst these particularly preferred embodiments most preferred are those organic solvents which volatilize when heated to a temperature of from about 90° C. to about 120° C. at atmospheric pressure. Illustrative of useful solvents are alcohols, esters, ketones, aldehydes, hydrocarbons and like organic solvents.

The last component of the suspension applied to the substrate in step two is a mixture of calcined glass/ceramics. The calcined glass/ceramic mixture is formed by forming a mixture of finely divided $Al_2O_3$, $SiO_2$ and MgO in the above-referenced proportions, together with one or more "effective fluxing and sintering agents" and optionally one or more "effective nucleating agents". As used herein, "effective fluxing and sintering agents" are fluxing and sintering agents which are effective to increase the adhesion of the ceramic glass to the metal substrate to any extent. These agents are precursor materials for the alkaline earth metal and/or alkali metal oxides, or boron oxide contained in the coating. Illustrative of effective fluxing and sintering agents are alkali metal salts such as $LiBO_2$, $ZnO/B_2O_3$, $Li_2O$, $ZnO$, $B_2O_3$, $Li_2B_4O_7$, $Na_2O$, $NaBO_2$, $Li_4B_6O_{11}$, $K_2O$, $CaO$, $LiF$, $NaF$, $LiCl$, $NaCl$, $Na_2SiF_6$, $Na_2B_4O_7$, $4CaO.5B_2O_3.9H_2O$, $LiAlSi_3O_8$, $Li_2Si_2O_5$, $BaB_2O_4$ and the like. Preferred effective fluxing and sintering agents are alkali metal borates, meta-borates and like borates such as $LiBo_2$, $ZnO/B_2O_3$, $Li_2B_4O_7$, $Li_2Si_2O_5$, $LiF$, $BaB_2O_4$, and $4CaO5B_2O_39H_2O$. Particularly preferred effective fluxing and sintering agents are lithium borates, zinc borates and metaborates. Amongst these particularly preferred effective fluxing and sintering agents are $LiBo_2$, $Li_2B_4O_7$ and $LiF$.

The amount of fluxing and sintering agents can vary widely. The amount of fluxing and sintering agents will depend on the amount of alkaline earth and/or alkali metal oxides, and boron oxides desired in the glass/ceramic composition. In general, the amount of such agents is from about 1 to about 15% based on the total weight of $Al_2O_3$, MgO and $SiO_2$ in the composition. In the preferred embodiments of the invention, the amount of fluxing and sintering agents is from about 5 to about 12 weight percent based on the total weight of $Al_2O_3$, MgO and $SiO_2$ in the composition, and in the particularly preferred embodiments of the invention the amount of fluxing and sintering agents is from about 7 to about 9 on the aforementioned basis. Partial substitution of $LiBO_2$ with $ZnO/B_2O_3$ limits reaction between $LiBO_2$ and the protective oxide on the metal substrate, thereby preventing such dissolution of the protective oxide coating which may expose any portion of the metal substrate to the flux. A superior dielectric coating having virtually no pinholes and minimal discoloration is thereby produced. Advantageously, with this partial substitution the firing time required for sintering of the ceramic coating is much less critical. Firing times formerly restricted to about 1-15 minutes can be extended over a broader time period (typically about 1-30 minutes and more), and firing temperature can be increased by as much as 50° C. Such expanded firing time and temperature parameters widen the processability window, facilitating scaled up production of the ceramic metal substrates. As a result, the fluxing and sintering agen comprised of $LiBO_2$ partially substituted with $ZnO/B_2O_3$ is especially preferred.

As used herein, "effective nucleating agents" are nucleating agents which promote the crystallization of residua glass phases. Illustrative of such nucleating agents are metal oxides such as $TiO_2$, $ZrO_2$, $Y_2O_3$, $Ta_2O_5$ and $La_2O_3$. Preferred nucleating agents are $TiO_2$ and $ZrO_2$, and a particularly preferred nucleating agent is $TiO_2$.

The effective nucleating agents are optional when used, and the amount thereof may vary widely. In general, the amount of such agents can vary from about 0 to about 11% by weight based on the total weight of $Al_2O_3$, MgO and $SiO_2$ in the composition. In the preferred embodiments of the invention, the amount of effective nucleating agents is from 2 to about 8 weight percent based on the total weight of MgO, $Al_2O_3$ and $SiO_2$ in the composition, and in the particularly preferred embodiments of the invention. The amount of effective nucleating agents is from about 4 to about 6 weight percent based on aforementioned basis.

Preparation of the calcine glass/ceramic mixture involves well known procedures. The raw materials are weighed and combined according to the desired proportions. The raw materials can be added as pure oxides, or alternatively, in equivalent forms containing volatile species which are eliminated during subsequent heating. For example, magnesium carbonate can be used in place of magnesium oxide, or boric acid can be used in place of boron oxide. Similarly, the lithium oxide, zinc oxide and boron oxide can be conveniently added in a precombined form such as $LiBO_2$, $Li_2B_4O_7$, or $ZnO/B_2O_3$. The raw materials are thoroughly mixed, typically by wet milling in a ball mill with added solvent, such as isopropanol in an amount sufficient to form a slurry of the desired proportion of ingredients.

After filtering and drying to form a powder the materials are calcined in order to produce the desired glass-/ceramic composition. Calcination may be carried out using conventional procedures. For example, this process may be carried out in a box furnace with a slow heat up to allow for removal of any residual volatiles. Peak temperatures may vary, typically being in the range from about 1100° C. to about 1300° C., and time at peak temperature may also vary, typically ranging from about 2 to about 20 hours. The resultant product is then pulverized and ball milled in an appropriate solvent such as isopropanol using standard ceramic processing equipment to produce particles nominally less than about 10 microns in diameter. This slurry is then filtered and dried to produce the fine powder which will subsequently be applied to a metal core together with one or more binders and organic solvents.

The amounts of the various ingredients in the suspension employed in the first step of the process of this invention can vary widely. Very dilute suspensions can be made for electrophoretic deposition and more concentrated suspensions for spraying, roller coating and the like. The preferred method in accordance with this invention is to make a high viscosity pase which is deposited in a screen printing process. The paste can be made with a variety of materials typical in the thick film industry. An illustrative formulation is a mixture of 65 weight percent ceramic powder combined with an organic vehicle containing ethyl cellulose dissolved in a high molecular weight alcohol. In general, the lower the concentration of suspended non-conductive materials in the suspension the more often the suspension must be applied to the metal to provide a given thickness of such bonded/sintered non-conductive material in the final glass-ceramic coated substrate; and conversely, the higher the concentration of suspended non-conductive materials in the suspension, the less often the suspension must be applied to the metal to provide a given thickness of bonded/sintered non-conductive material in the glass-ceramic coated substrate. In general, the concentration of organic solvents in the suspension will vary from about 5 to about 50 weight percent, the concentration of the non-conductive materials in the suspension will vary from about 40 to about 85 weight percent, and the concentration of polymeric binders in the suspension will vary from about 1 to about 15 weight percent based on the total weight of the suspension. In the preferred embodiments of the invention, the concentration of organic solvents in the suspension will vary from about 10 to about 45 weight percent, the concentration of non-conductive materials in the suspension will vary from about 45 to about 80 weight percent, and the concentration of polymeric binders in the suspension will vary from about 1 to about 10 weight percent. In the particularly preferred embodiments, the concentration of organic solvents in the suspension is from about 20 to about 40 weight percent, to concentration of non-conductive materials in the suspension is from about 50 to about 75 weight percent suspension is from about 1 to about 5 weight percent. All weight percents are based on the total weight of the suspension.

The suspension is applied to one or more surfaces of the metal in a predetermined pattern. The suspension can be applied over all of the surfaces or over a portion thereof. Any suitable technique useful for applying a suspension to the surface of a solid material can be used. Illustrative of useful techniques are screen printing, pad printing, dipping, spraying and the like. Such techniques of applying suspensions to a substrate are well known in the art and will not be described herein in great detail. Application by use of screen printing is preferred in accordance with this invention because of the ease with which patterns can be generated which allow open areas for mounting holes, ground plane interconnects, and electrically isolated vias from one side to the other. Typically, the pattern is printed on both sides of the metal in order to maintain uniform stress and eliminate bowing.

The suspension can be applied in a single application or multiple applications can be made depending on the desired thickness of the layer of non-conductive material in the finished product. In the preferred embodiments there are from 1 to about 6 printed layers depending on the desired thickness and in the most preferred embodiments of the invention only about 2 to about 3 layers. In some instances it is preferred that the final top layer ceramic composition differ from the underlying layer or layers. In this way one can take advantage of those ceramic compositions with superior adhesive properties for direct contact to the metal core and those compositions with superior electrical properties for contact with the overlying circuitry.

The amount of the suspension applied to the metal at any particular situs will vary widely depending on the desired thickness of the non-conductive material in the final glass-ceramic coated substrate. The amount of the suspension applied to the metal is sufficient, usually, to provide a layer of sintered non-conductive material bonded to the metal of a thickness of at least about 20 microns. In the preferred embodiments of the invention, the amount applied is sufficient to provide a layer of non-conductive material having a thickness of from about 25 microns to about 85 microns, and in the particularly preferred embodiments, the amount applied is sufficient to provide a layer of non-conductive material having a thickness of from about 30 microns to about 70 microns. Amongst these particularly preferred embodiments of this invention, most preferred are those embodiments in which the amount of suspension applied to the metal is sufficient to provide a layer of sintered non-conductive material bonded to the metal having a thickness of from about 40 microns to about 60 microns.

In the third step of the process of this invention, the metal to which the suspension has been applied in the desired predetermined pattern and in the desired amount heated at a temperature and for a time sufficient to remove substantially all of the organic solvent from the applied suspension and to sinter the non-conductive material, and to bond the sintered material to the metal substrate or substrates as the case may be and to crystallize the residual glassy phase of the non-conductive material. The firing procedure is important in that it determines the degree of adhesion and structure of the ceramic coating. The article is preferably placed in a room temperature furnace which is subsequently programmed for a given temperature and time profile. In the preferred embodiments of the invention, the heating step is divided into two portions and has at least two plateaus. In these preferred embodiments, the metal substrate to which the suspension has been applied is first heated to a temperature sufficient to volatilize the solvents from the suspension, preferably in less than about one hour without disturbing the integrity of the remaining composition to form a coating of a composition containing essentially no solvent and which comprises the finely divided non-conductive material and the binders coated on the surface of the substrate in the predetermined pattern. The purpose of this step is to ensure complete volatilization of the polymer binder so that preferably substantially no carbon containing residual is present. The heating step can be carried out in an air atmosphere, or in an atmosphere of non-oxidizing gas. Obviously, this heating temperature can vary widely depending on the volatilization temperature of the particular solvent or solvents employed. Usually, however, the heating step is carried out at a temperature equal to or less than about 200° C. for a period equal to or less than about 4 hours. In the preferred embodiments using preferred solvents, this heating step is carried out at a temperature of from about 50° C. to about 200° C. at atmospheric pressure for a period equal to or less than about 2 hours, and in the particularly preferred embodiments of the invention using particularly preferred solvents at a temperature of from about 75° C. to about 150° C. at atmospheric pressure for a period equal to or less than about 1 hour. In the most preferred embodiments of the invention employing most preferred solvents, the first part of the heating step is carried out at a temperature of from about 90° C. to about 120° C. at atmospheric pressure for a period equal to or less than about 0.5 hour.

In the second step of the split heating procedure, the metal and coated composition from which the solvents have been substantially removed are heated at a temperature and for a time sufficient to degrade substantially all of the polymer organic binders in the composition and sinter the finely divided non-conductive material and bond same to one or more surfaces of the metal as the case may be, to produce a substantially uniform coating of finely divided non-conductive material on one or more surfaces of the metal. The heating temperature employed in the second part of the split heating step can vary widely and will depend on the particular polymer binders, non-conductive materials and metals employed and the temperature employed in the substrate heating step.

Polymer degrading and sintering can be carried out in a single step or in multiple steps. Preferably, polymer degrading and sintering are carried in two steps. In the first step, the polymer is degraded. In this step, the coated substrate from which solvent has been removed is heated at a temperature and for a time sufficient to degrade the polymer. Usually, this heating step is carried out at a temperature equal to or greater than about 200° C. for a period equal to or less than about 4 hours. In the preferred embodiments using preferred polymers, the polymer degrading step is carried out at a temperature of from about 200° C. to about 800° C. for a period equal to or less than about 2 hours and in the particularly preferred embodiments using particularly preferred polymers is carried out at a temperature of from about 300° C. to about 700° C. for a period equal to or less than about 1 hour. In the most preferred embodiments of the invention employing most preferred polymers, the polymer degrading heating step is carried out at a temperature of from about 400° C. to about 600° C. for a period equal to or less than about 0.5 hour.

After the polymer has been degraded to the desired extent, the coated substrate is then heated at a temperature and for a time sufficient to sinter the finely-divided non-conductive material and bond same to the surface of the metal substrate. In general, the coated substrate is heated at a temperature below the melting point of the metal of the substrate for a period equal to or less than about 2 hours to sinter and bond the non-conductive material to the substrate. In the preferred embodiments of the invention, the coated substrate is heated at a temperature from about 1000° C. to about 1220° C. for a period equal to or less than 1 hour, and in the particularly preferred embodiments of the invention, the coated substrate is heated at a temperature of from about 1060° C. to about 1200° C. for a period equal to or less than 0.5 hour. Amongst these particularly preferred embodiments, most preferred are those embodiments in which the coated substrate is heated at a temperature of from about 1150° C. to about 1200° C. for a period equal to or less than 30 minutes. Subsequent cool down is not critical and the natural cooling rate of the unpowered furnace is generally adequate.

During sintering, some vitrification of the glass-/ceramic may occur. This residual glass structure is not desirable and can be substantially eliminated by a final heat treatment. In this heat treatment step, the coated metal substrate is heated to a temperature and for a time sufficient to crystallize the residual glassy phase to the desired extent. Heating temperatures and times may vary widely depending on the nature of the components of the coating. This procedure can be carried out in a single step or in multiple steps. In the preferred embodiment of the invention, the procedure is carried out in two steps. In the first step, the coated metal substrate is usually heated to a temperature of from about 600° C. to about 900° C. for a period equal to or less than about 1 hour. In the preferred embodiments of the invention, the substrate is heated to a temperature from about 650° C. to about 850° C. for a period equal to or less than about 0.5 hour, and in the most preferred embodiments of the invention, the coated substrate is heated for a period equal to or less than about 15 minutes at a temperature of from about 700° C. to about 800° C. In the second step of this split heating step, the coated substrate is heated at a temperature of from about 800° C. to about 1100° C. over a period of from about 1 to about 6 hours. In the preferred embodiments of the invention, the heating temperature is from about 800° C. to about 1050° C. and the heating period is from about 1 to about 6; and in the particularly preferred embodiments of the invention, heating temperatures are from about 850° C. to about 1000° C. and heating times are from about 1 to about 4 hours. Amongst these particularly preferred embodiments of this invention, most preferred are those embodiments in which heating temperatures of from about 900° C. to about 950° C. and heating times of from about 1 to about 3 hours are employed.

The substrate so formed can be used to form electronic substrates. For example, suspension of a finely divided metal, as for example, the metal used as the solid metal substrate, such as copper, silver, gold aluminum, palladium, platinum and the like and alloys thereof, and containing one or more organic solvents having one or more polymeric binders dissolved herein is applied to surface of the sintered and bonded non-conductive material. The combination is thereafter heated to volatilize substantially all of the solvents from the suspension and to degrade substantially all of the binders thereby sintering the finely divided metal and bonding said sintered metal to the surface of the non-conductive material. The suspension can be applied to one or more surfaces of sintered and bonded non-conductive material in a predetermined pattern. The suspension can be applied over all of the surfaces or a portion thereof using the same techniques employed in the suspension application step 1. The suspension can be applied in a single application or multiple applications can be made depending on the desired thickness of the layer of metal in the finished electronic device. The components and the relative amounts of the components of the suspension are as used in the suspension of step 1.

In an alternative embodiment of the process of this invention, the combination of the metal and coated composition are used directly in the third step of the process. In this procedure, the thermal degradation of the binders, and the sintering and heat bonding of both the sintered non-conductive layer and the sintered metal layer are accomplished in a single high temperature second part of the split heating step.

The solvent volatilization, polymer degradation, and sintering procedures used in this step are essentially the same as used in step two of the process of this invention in heating the suspension of the non-conductive material to remove the solvents, degrading the polymers kinds, and sintering and bonding the resulting composition to the surface of the solid conductive material. As in the case of the earlier heating step 2, the heating step of this procedure is preferably carried out in two stages. In the first stage of the heating procedure, the applied suspension is heated to a temperature and for a time which is sufficient to volatilize the one or more solvents from the applied suspension. In the second stage of the heating procedure, the substrate coated with the dried suspension is heated at a temperature and for a time which is sufficient to sinter the finely divided metal and bond the sintered metal to the surface of the non-conductive layer. In the case of the alternative embodiment of the process of this invention, the coated substrate is also heated to a temperature and for a time sufficient to sinter the finely divided non-conductive material and bond the material to the surface of the metal substrate. Usually in the case of the alternative embodiment, the coating of the finely divided metal and the coating of the non-conductive material are sintered and bonded using substantially the same heating conditions.

The thickness of the conductive layer is not critical and can vary widely. Usually, the layer has a thickness of from about 0.005 to about 0.075mm. In the preferred embodiments of the invention, the conductive layer has a thickness of from about 0.01 to about 0.06mm, and in the particularly preferred embodiments of the invention has a thickness of from about 0.015 to about 0.05mm. Amongst these particularly preferred embodiments most preferred are those embodiments in which the conductive layer has a thickness of from about 0.02 to about 0.03mm.

The process of this invention can be used to manufacture electronic devices of this invention. Such devices vary widely and include circuit board, capacitors and the like. The process is preferred for use in the manufacture of circuit boards.

The following specific examples are present to more particularly illustrate the invention and are not intended to limit the scope of the invention.

EXAMPLES 1 TO 18

General Procedure

A mixture of MgO, $Al_2O_3$, and $SiO_2$, close to stoichiometric ratio of 2:2:5 (cordierite) and about 4–10 wt% of $Li_2O$-$B_2O_3$, $ZnO$/$B_2O_3$ with 0–10 wt% $TiO_2$ is ball milled in isopropanol to insure proper mixing and melt homogeneity. The slurry is then filtered, dried and calcined at 1100°–1300° C. for 4–12 hours. The solid product is then pulverized to form the compositions set forth in the following Table I.

TABLE I

| Composition No. | Weight % | | | | | | |
|---|---|---|---|---|---|---|---|
| | MgO | $Al_2O_3$ | $SiO_2$ | $Li_2O$ | $B_2O_3$ | $TiO_2$ | ZnO |
| 1 | 12.5 | 31.7 | 46.7 | 2.7 | 6.3 | 0.0 | 0.0 |
| 2 | 12.4 | 31.4 | 46.2 | 3.0 | 7.0 | 0.0 | 0.0 |
| 3 | 12.5 | 31.7 | 46.7 | 1.6 | 7.4 | 0.0 | 0.0 |
| 4 | 12.4 | 31.4 | 46.2 | 1.8 | 8.2 | 0.0 | 0.0 |
| 5 | 11.7 | 29.6 | 43.7 | 2.7 | 12.3 | 0.0 | 0.0 |
| 6 | 12.5 | 32.0 | 47.0 | 2.6 | 5.9 | 0.0 | 0.0 |
| 7 | 9.7 | 47.6 | 36.2 | 2.0 | 4.5 | 0.0 | 0.0 |
| 8 | 22.7 | 20.0 | 45.4 | 2.4 | 5.5 | 4.0 | 0.0 |
| 9 | 12.0 | 30.5 | 45.0 | 2.4 | 5.6 | 4.5 | 0.0 |
| 10 | 12.3 | 31.2 | 45.9 | 1.8 | 4.2 | 4.6 | 0.0 |
| 11 | 22.7 | 19.1 | 45.2 | 2.4 | 5.6 | 5.0 | 0.0 |
| 12 | 11.2 | 28.3 | 41.7 | 2.5 | 5.8 | 10.5 | 0.0 |
| 13 | 12.0 | 30.2 | 44.5 | 0.0 | 3.6 | 4.4 | 5.3 |
| 14 | 11.0 | 27.6 | 40.7 | 1.1 | 4.6 | 4.5 | 10.0 |
| 15 | 14.8 | 24.3 | 47.5 | 1.1 | 4.6 | 4.5 | 3.2 |
| 16 | 16.0 | 25.0 | 45.0 | 1.1 | 4.7 | 5.0 | 3.2 |
| 17 | 16.8 | 26.3 | 50.5 | 1.2 | 5.0 | 0.0 | 3.2 |
| 18 | 17.2 | 24.3 | 47.5 | 1.4 | 5.8 | 0.0 | 3.8 |

The pulverized product can be blended with a suitable organic vehicle to form a printable paste.

The substrate was a nickel alloy (214 Haynes Corporation). The surface of this alloy is first chemically etched for at least 30 minutes, bead blasted for initial oxide removal, followed by heat treatment at a temperature at which the final product (coated substrate) is fired. This step provides an oxide layer which enhances the bonding between the metal and coating. This also prevents diffusion of metal into the coating, causing discoloration. After surface preparation, the metal is coated with the ceramic paste via screen printing. The printed substrates are allowed to settle at room temperature for 15-20 minutes followed by drying at 120° C. for 30-45 minutes. The dried samples are then fired in air at 1140°-1300° C. for 1-15 minutes. The fired products can either be quenched at room temperature or allowed to cool slowly at the furnace cooling rate (ca. 40° C/minute). The final step in this process is heat treatment of the final products at 750°-1000° C. for 2-24 hours to crystallize the residual glassy phase. The following Table II sets forth the processes and materials which produce good adhesion between the ceramic and metal.

between 125° C. and −55° C. liquid heat sinks. Results are set forth in the following Table III.

TABLE III

| Parameter | Initial | After 150 cycles |
| --- | --- | --- |
| Resistivity (ohm-cm) | $7.3 \times 10^{13}$ | $6.9 \times 10^{13}$ |
| Dielectric Constant (1 MHz) | 6.5 | 6.7 |
| Dissipation Factor (1 MHz) | 0.0060 | 0.0062 |

Despite the large TCE difference (metal=13.3, ceramic=2.3), no catastrophic failure was detected.

TABLE II

Example of Ceramic Coated Metal Composites
(The metal was chemically etched or sanded)

| | Metal Preparation Process | | | | Firing Conditions | |
| | | Heat Treatment in Air | | | Peak | |
| Example No. | Initial Oxide Removal | Temp (°C.) | Time (hrs) | Ceramic Comp. | Temp (°C.) | Time (min) |
| --- | --- | --- | --- | --- | --- | --- |
| 1 | FeCl$_3$/HCl Etch | 800 | 0.5 | 1 | 1150 | 20 |
| 2 | FeCl$_3$/HCl Etch | 800 | 0.5 | 1 | 1300 | 1 |
| 3 | FeCl$_3$/HCl Etch | 800 | 0.5 | 2 | 1300 | 1 |
| 4 | FeCl$_3$/HCl Etch | 800 | 0.5 | 3 | 1300 | 1 |
| 5 | FeCl$_3$/HCl Etch | 800 | 0.5 | 4 | 1300 | 1 |
| 6 | FeCl$_3$/HCl Etch | 800 | 0.5 | 5 | 1150 | 1 |
| 7 | H$_2$SO$_4$/HCl | 1200 | 0.5 | 7 | 1250 | 2 |
| 8 | H$_2$SO$_4$/HCl | 1200 | 0.5 | 7 | 1275 | 2 |
| 9 | H$_2$SO$_4$/HCl | 1200 | 0.5 | 8 | 1200 | 2 |
| 10 | H$_2$SO$_4$/HCl | 1200 | 0.5 | 8 | 1225 | 2 |
| 11 | H$_2$SO$_4$/HCl | 1200 | 0.5 | 8 | 1250 | 2 |
| 12 | H$_2$SO$_4$/HCl | 1200 | 0.5 | 9 | 1200 | 2 |
| 13 | H$_2$SO$_4$/HCl | 1200 | 0.5 | 9 | 1225 | 2 |
| 14 | H$_2$SO$_4$/HCl | 1200 | 0.5 | 9 | 1250 | 2 |
| 15 | H$_2$SO$_4$/HCl | 1200 | 0.5 | 10 | 1225 | 2 |
| 16 | H$_2$SO$_4$/HCl | 1200 | 0.5 | 12 | 1200 | 2 |
| 17 | H$_2$SO$_4$/HCl | 1220 | 0.25 | 11 | 1175 | 2 |
| 18 | Sand, 400 grit | 1150 | 8 | 9 | 1160 | 10 |

EXAMPLE 19

Aggalloy was degreased and heat treated in air for 45 minutes at 1200° C. to build up an oxide layer. The metal was then printed with a paste containing dielectric composition 9, dried, fired at 1175° C. for three minutes, and then heat treated at 900° C. for two hours. The resultant ceramic had very good adhesion to the metal.

EXAMPLE 20

The identical dielectric and process procedure of Example 19 was used with Fecralloy as the supporting metal. Again, there was very good adhesion of ceramic to metal.

EXAMPLE 21

Alloy 214 was etched in H$_2$SO$_4$/HCl for 30 minutes to remove the oxide surface from as-received metal. It was then heat treated in air at 1200° C. for 30 minutes. Dielectric composition number 9 was printed with two layers on each side of the metal. This was then followed by dielectric composition 6 printed in one layer on each side. The parts were fired at 1180° C. for two minutes in a tube furnace followed by heat treatment at 900° C. for 15 minutes in a box furnace.

Thick film Pd/Ag conductors were printed and fired (850° C/10 minutes) on these parts to determine electrical properties of the ceramic dielectric.

The parts wee then subjected to repetitive thermal shock cycling as per MIL-STD-883C, Method 1011.5B

EXAMPLE 22

A series of tests were carried out to compare the substrate of Example 21 to alumina with regard to adhesion and conductivity of commercially available hybrid thick film materials applied to the surface of the ceramic using a selection of conductive inks. Although applications for thick film on Al$_2$O$_3$ are limited due to relatively complex (and costly) packaging schemes needed for mechanical fastening and to protect the fragile alumina from mechanical stress caused by shock, vibration and TCE mismatch, Al$_2$O$_3$ was selected for evaluation because of its superior electronic properties.

Materials from several thick film paste suppliers were printed on the substrate of Example 21 and compared to results on Al$_2$O$_3$. The test samples were screened on an MPM TF-100 Printer and fired in a BTU furnace with standard commercial 850° C. profile. The Alumina substrates were Coors 96% material.

Adhesion tests were performed on the four metallizations using the procedure described in DuPont technical literature (80 mil squares) using an Instron model 1123. Conductivity of the four metallizations was measured using a 500 Square serpentine pattern 0.010" wide.

Results of the study are shown in Table IV.

In the Table IV, the abbreviations have the following meanings :

(a) "ESL 9633B" is Ag/Pd past manufactured and sold by ESL Corporation.

(b) "EMCA C3325" is Ag/Pd past manufactured and sold by EMCA Corporation.

(c) "DuPont 9770" is Ag/Pd past manufactured and sold by Dupont Company.

(d) "Engelhard A3058" is Ag/Pd past manufactured and sold by Englehard corporation.

(e) "CCM" is the glass/ceramic coated substrate of EXAMPLE 21.

TABLE IV

Properties of Thick Film Conductors Fired at 850° C. for 10 minutes

| Conductor | Adhesion (lbs/0.080" square) | | | | Conductivity (Siemens/square) | |
|---|---|---|---|---|---|---|
| | Initial | | After 24 hrs @ 150° C. | | | |
| | CCM | $Al_2O_3$ | CCM | $Al_2O_3$ | CCM | $Al_2O_3$ |
| ESL 9633B | 5.4 | 5.9 | 4.0 | 4.3 | 13 | 21 |
| EMCA C3325 | 4.8 | 5.7 | 2.0 | 5.4 | 15 | 27 |
| DuPont 9770 | 6.1 | 5.9 | 3.0 | 3.0 | 120 | 240 |
| Engelhard A3058 | 4.2 | 5.5 | 1.4 | 1.7 | 120 | 150 |

In general, the range of conductivities available on the EXAMPLE 21 system overlaps quite well with alumina for the materials tested, and any reduced disadvantages attendant to conductivities are more than offset by the superior mechanical properties of the EXAMPLE 21 substrate.

The results of Table IV show that for initial adhesion the adhesion properties of the Comp 2 substrate are comparable to those of alumina. One substrate which was initially comparable to alumina by weakened after aging at 150° C. However, the final level achieved was still better than the worst case on alumina with another material.

EXAMPLES 23-30

The procedure of EXAMPLES 1-18 was repeated, except that, instead of chemical etching or sanding, the surface of Alloy 214 was blast cleaned by glass beads, then heat treated in air using the time/temperature profiles provided in table V. The procedure employed in surface preparation and coating for EXAMPLES 23-30 is set forth below.

Both sides of 2"×2" pieces of alloy 214 were blast cleaned for about 2 minutes by glass beads having 1 100-200 diameter and blasting pressure of about 60-90 psi. This process effected removal of 4-6 microns from the surface of each side of the metal. The parts were then cleaned by sequential sonication in detergent/water solution, tap water deionized water and finally methanol. Each sonication cycle was conducted for 10 minutes at an operating temperature of 50° C. The parts were then heat treated in air according to Table V, and cleaned by repeating the above cleaning steps. Dielectric number 15 was printed with two layers on each side of the metal. This was then followed by dielectric composition 18, printed in one layer on each side. The parts were fired in a programmable box furnace at 1170° C. for five minutes, followed by nucleation at 750° C. for 45 minutes and crystallization at 900° C. for 45 minutes.

Parts prepared employing the procedure described in this example showed good adhesion, no discoloration and no pinholes.

TABLE V

METAL PREPARATION PROCESS

| Example No. | Initial Oxide Removal | Heat Treatment in Air | | Ceramic Comp. Top/Bottom | Firing Conditions | | Rank* |
|---|---|---|---|---|---|---|---|
| | | Temp. (°C.) | Time (hrs) | | Peak Temp (°C.) | Time (min) | |
| 23 | glass bead blasting | 1100 | 4 | 18/15 | 1170 | 5 | 2 |
| 24 | glass bead blasting | 1100 | 8 | 18/15 | 1170 | 5 | 3 |
| 25 | glass bead blasting | 1160 | 4 | 18/15 | 1170 | 5 | 3 |
| 26 | glass bead blasting | 1160 | 6 | 18/15 | 1170 | 5 | 4 |
| 27 | glass bead blasting | 1160 | 8 | 18/15 | 1170 | 5 | 5 |
| 28 | glass bead blasting | 1120 | 4 | 18/15 | 1170 | 5 | 5 |
| 29 | glass bead blasting | 1200 | 6 | 18/15 | 1170 | 5 | 5 |
| 30 | glass bead blasting | 1200 | 8 | 18/15 | 1170 | 5 | 5 |

*All the parts prepared according to Table V showed excellent adhesion between the ceramic coating and the metal with virtually no pinholes. The parts have been ranked from 1 (discolored) to 5 (no discoloration).

The combination of bead blasting/heat treating produced surfaces with superior uniformity and significant improvement in the ceramic to metal adhesion. The bead blasting/heat treating process also eliminated the problems associated with batch to batch variation of the core metal.

EXAMPLE 31

In packaging high power devices which require efficient removal of heat from the semiconductor, it is possible to enhance the thermal conductivity of the substrate. In this example, this was accomplished by replacing approximately 0.56mm of Alloy 214 with 4.8mm of nickel 200. The following table of calculated properties shown the improved performance achievable.

| | Thermal conductivity (W/cm-°C.) | |
|---|---|---|
| | z axis | x,y axis |
| Standard Construction | 0.066 | 0.09 |
| 0.076 mm ceramic on both sides of 1.106 mm alloy 214 | | |
| Enhanced Construction | 0.29 | 0.67 |
| 0.076 mm ceramic | | |
| 0.229 mm alloy 214 | | |
| 4.763 mm nickel 200 | | |
| 0.299 mm alloy 214 | | |
| 0.076 mm ceramic | | |
| Bulk Material | | |
| Ceramic | 0.02 | |
| Alloy 214 | 0.1 | |

| | Thermal conductivity (W/cm-°C.) | |
|---|---|---|
| | z axis | x,y axis |
| Nickel 200 | | 0.75 |

The enhanced construction metal core was made in this example by explosively cladding the materials together, but other techniques, such as rolling, are available. All other processes for pretreating the metal, coating the ceramic, and firing are as previously disclosed. The absolute thermal conductivity of this construction was not measured, but in a specific use application (with deposited circuitry and high power semiconductor devices) the measured temperature differentials were as predicted by the data above. Specifically, a calculated thermal resistance of 3.9 /W (for the enhanced construction) was found experimentally to be actually somewhat lower at 3.5 /W, thus verifying the potential performance improvements.

What is claimed is:

1. A glass/ceramic coated substrate having a metal core and having on at least a portion, of the surface of the metal core a coating of a glass/ceramic, said coating being
   a non-conductive layer having thickness ranging from about 0.020mm to about 0.100mm and comprising (on an oxide basis):
   (a) from about 8 to about 26% by weight of magnesium oxide (MgO) based on the total weight of the coating;
   (b) from about 10 to about 49% by weight of aluminum oxide ($Al_2O_3$) based on the total weight of the coating;
   (c) from about, 42 to about 68% by weight of silicon oxide ($SiO_2$) based on the total weight of the coating and
   (d) from about 1 to about 15% by weight, based on the total weight of MgO, $Al_2O_3$ and $SiO_2$ in the coating of boron oxide and one or more of alkali metal oxides, alkaline earth metal oxides and ZnO.

2. A glass/ceramic substrate according to claim 1 wherein said coating comprises (on an oxide basis):
   (a) from about 9 to about 22% by weight of MgO;
   (b) from about 16 to 45% by weight of $Al_2O_3$; and
   (c) from about 43 to about 63% by weight of $SiO_2$.

3. A glass/ceramic substrate according to claim 2 wherein said coating comprises (on an oxide basis):
   (a) from about 10 to about 18% by weight of MgO;
   (b) from about 23 to about 40% by weight of $Al_2O_3$; and
   (c) from about 44 to about 58% by weight of $SiO_2$.

4. A glass/ceramic substrate according to claim 3 wherein said coating comprises (on an oxide basis):
   (a) from about 12 to about 14% by weight of MgO;
   (b) from about 30 to about 35% by weight of $Al_{23}$; and
   (c) from about 45 to about 52% by weight of $SiO_2$.

5. A glass/ceramic substrate according to claim 1 wherein said coating comprises cordierite ($2MgO-2Al_2O_3-5SiO_2$).

6. A glass/ceramic coated substrate according to claim 1 wherein said coating comprises cordierite ($2Mg)-2Al_2O_3-5SiO_2$) and sapphirine ($4MgO-5Al_2O_3-2SiO_2$).

7. A glass/ceramic coated substrate according to claim 1 wherein said coating comprises zinc borate.

8. A glass/ceramic coated substrate according to claim 1 which further comprises an alkali metal oxide and a boron oxide.

9. A glass/ceramic coated substrate according to claim 1 which further comprises lithium oxide and boron oxide and ZnO.

10. A glass/ceramic coated substrate according to claim 9 wherein said coating comprises cordierite ($2MgO-2Al_2O_3-5SiO_2$), and spodumene ($Li_2O-Al_2O_3-4SiO_2$).

11. A glass/ceramic coated substrate according to claim 9 wherein said coating comprises cordierite ($2Mg)-2Al_2O_3-5SIO_2$), spodumene ($Li_2O-Al_2O_3-4SiO_2$), and sapphirine ($4MgO-5Al_2O_3-2SiO_2$).

12. A glass/ceramic according to claim 1 which further comprises (on an oxide basis):
   (d) from about 5 to about 12% by weight based on the total weight of $Al_2O_3$, MgO and $SiO_2$ in the coating, of one or more alkali metal, alkaline earth metal, and zinc oxides and boron oxide.

13. A glass/ceramic coated substrate according to claim 12 which further comprises (on an oxide basis):
   (d) from about 7 to about 9% by weight of one or more alkali metal and/or alkaline earth metal oxides, zinc oxide and boron oxides.

14. A glass/ceramic coated substrate according to claim 1 which further comprises (on an oxide basis):
   (e) up to about 11% by weight based on the total weight of $Al_2O_3$, $SiO_2$ and MgO of a transition or transition earth metal oxide which functions as a nucleating agent and/or a flux.

15. A glass/ceramic coated substrate according to claim 14 wherein the amount of said transition or transition earth metal oxide is from about 2 to about 8% by weight.

16. A glass/ceramic coated substrate according to claim 15 wherein the amount of said transition or transition earth metal oxide is from about 1 to about 10 weight percent.

17. A glass/ceramic coated substrate according to claim 14 wherein said transition or transition earth metal oxide is selected from the group consisting of $TiO_2$, $ZrO_2$, $Y_2O_3$ and $La_2O_3$.

18. A glass/ceramic coated substrate according to claim 17 wherein said transition or transition earth metal oxide is selected from the group consisting of $TiO_2$, $ZrO_2$ and ZnO.

19. A glass/ceramic coated substrate according to claim 18 wherein said transition or transition earth metal oxide is $TiO_2$.

20. A glass/ceramic coated substrate according to claim 1 said coating consisting essentially of (on an oxide basis and based on the total weight of the coating):
   (a) from about 9 to about 23 weight percent of magnesium oxide;
   (b) from about 19 to about 48 weight percent of aluminum oxide;
   (c) from about 36 to about 47 weight percent of silicon dioxide;
   (d) from about 1 to about 3 weight percent of lithium oxide;
   (e) from about 1 to about 10 weight percent of zinc oxide;
   (f) from about 4 to about 13 weight percent of a boron oxide; and
   (g) from about 0 to about 11 weight percent of titanium dioxide or zirconium oxide.

21. A glass/ceramic coated substrate according to claim 20 wherein said glass/ceramic has a thermal coefficient of expansion of from about 50° to about 250° C. less than about 4 ppm/° C. and said metal core has a thermal coefficient of expansion from about 50° to about 250° C. greater than about 12 ppm/° C.

22. A glass/ceramic coated substrate according to claim 20 wherein said glass/ceramic has a dielectric constant of less than about 8.

23. A glass/ceramic coated substrate according to claim 20 in which the glass/ceramic consists essentially of cordierite, $2MgO-2Al_2O_3-5SiO_2$, and spodumene $(Li_2O-Al_2O_3-4SiO_2)$.

24. A glass/ceramic coated substrate according to claim 19 which includes sapphirine $(4MgO-5Al_2O_3-2Si)_2)$.

25. A glass/ceramic coated substrate according to claim 24 which includes from about 2 to about 8% by weight of $TiO_2$.

26. A glass/ceramic coated substrate according to claim 25 wherein said glass/ceramic has a thermal coefficient of expansion from about 50° C. to about 250° C. of from about 1.9 to about 2.5 ppm 1° C.

27. A glass/ceramic coated substrate according to claim 1 wherein said metal core is composed of a metal which can be exposed to temperatures in excess of 1100° C. in an oxidizing atmosphere without excessive spalling.

28. A glass/ceramic coated substrate according to claim 27 wherein said metal core is composed of an alloy of nickel or iron.

29. A glass/ceramic coated substrate according to claim 28 in which the core metal is comprised of a nickel based alloy containing chromium, aluminum, iron and yttrium.

30. A glass/ceramic coated substrate according to claim 29 in which the core metal is Haynes alloy number 214 of nominal composition 77 weight percent nickel, 16 weight percent chromium, 4.5 weight percent aluminum, 2.5 weight percent iron, and a trace of yttrium.

31. A glass/ceramic coated substrate according to claim 28 in which the core metal is comprised of an iron based alloy containing chromium and aluminum.

32. A glass/ceramic coated substrate according to claim 27, in which said metal core is a composite structure.

33. A glass/ceramic coated substrate according to claim 32 wherein said metal core has outer layers composed of an alloy of nickel or iron and an inner layer composed of a metal having thermal conductivity greater than that of said outer layers.

34. A glass/ceramic coated substrate according to claim 33, in which said outer layers are composed of a nickel based alloy containing chromium, aluminum, iron, and yttrium.

35. A glass/ceramic coated substrate according to claim 34 in which the outer layers are composed of Haynes Alloy number 214 of nominal composition 77 weight percent nickel, 16 weight percent chromium, 4.5 weight percent aluminum, 2.5 weight percent iron and a trace of yttrium.

36. A glass/ceramic coated substrate according to claim 33, wherein said outer layers are comprised of an iron based alloy containing chromium and aluminum.

37. A glass/ceramic coated substrate according to claim 33 wherein said inner layer is composed of nickel.

38. A glass/ceramic coated circuit board which comprises a metal substrate, having coated on at least a portion of the surface thereof a glass/ceramic coating and having devised on at least a portion of the surface of the coating an electrical circuit, said coating being a non-conductive layer having thickness ranging from about 0.020mm to 0.100mm and comprising (on an oxide basis);
 (a) from about 8 to about 26% by weight of MgO based on the total weight of the coating;
 (b) from about 10 to about 49% by weight of $Al_2O_3$ based on the total weight of the coating;
 (c) from about 42 to about 68% by weight of $SiO_2$ and based on the total weight of the coating;
 (d) from about 1 to about 15% by weight, based on the total weight of MgO, $Al_2O_3$ and $SiO_2$ in the coating of boron oxide and one or more of alkali metal oxides, alkaline earth metal oxides and zinc oxide.

39. A glass/ceramic coated circuit board according to claim 27 said glass/ceramic having an oxide composition consisting essentially of:
 (a) from about 9 to about 23 weight percent of magnesium oxide;
 (b) from about 19 to a bout 48 weight percent of aluminum oxide;
 (c) from about 36 to about 47 weight percent of silicon dioxide;
 (d) from about 1 to about 3 weight percent of lithium oxide;
 (e) from about 1 to about 10 weight percent of zinc oxide;
 (f) from about 4 to about 13 weight percent of boron oxide;
 (g) from about 0 to about 11 weight percent of titanium dioxide or zirconium oxide; said coating having defined thereon an electrical circuit.

40. The circuit board according to claim 39 wherein said glass/ceramic has a thermal coefficient of expansion from about 50° to about 250° C. less than about 4 ppm/° C. and said metal core has a thermal coefficient of expansion from about 50° to about 250° C. greater than about 12 ppm° C.

41. The circuit board according to claim 39 wherein said glass/ceramic has a dielectric constant less than 8.

42. The circuit board according to claim 39 wherein said glass/ceramic consists essentially of cordierite, $(2MgO-2Al_2O_3-5SiO_2)$, and spodumene $(Li_2O-Al_2O_3-4SiO_2)$.

43. The circuit board according to claim 39 in which the core metal is comprised of a nickel based alloy containing chromium, aluminum, iron, and yttrium.

44. The circuit board according to claim 43 in which the core metal is Haynes alloy number 214 of nominal composition 77 weight percent nickel, 16 weight percent chromium, 4.5 weight percent aluminum, 2.5 weight percent iron, and a trace of yttrium.

45. The circuit board according to claim 39 in which the core metal is comprised of an iron based alloy containing chromium and aluminum.

46. The circuit board according to claim 39 in which the glass/ceramic coating is deposited in two or more layers, said layers consisting of different compositions.

47. The circuit board according to claim 46 having a first layer with an oxide composition containing about 12.0% magnesium oxide, about 30.5% aluminum oxide, about 45.0% silicon dioxide, about 2.4% lithium oxide, about 5.6% boron oxide, and about 4.5% titanium dioxide, and a second layer with an oxide composition containing about 12.5% magnesium oxide, about 32.0% aluminum oxide, about 47.0% silicon dioxide, about 2.6% lithium oxide and about 5.9% boron oxide.

48. A process for manufacturing a glass ceramic coated substrate having a metal core and having on at least a portion of the surface of the metal core a coating of a glass ceramic, said process comprising:
 (a) abrading and cleaning said surface to remove metal oxides therefrom;
 (b) heating said surface in the presence of oxygen at a first temperature for a time sufficient to form an oxide layer thereon;
 (c) applying to all or a portion of said surface in a pre-determined pattern a suspension comprising one or more organic solvents, one or more heat degradable polymeric binders and a mixture of calcined finely divided comprising on an oxide basis:
  (i) from about 8 to about 26% by weight of MgO;
  (ii) from about 10 to about 49% by weight of $Al_2O_3$; and
  (iii) from about 42 to about 68% by weight of $SiO_2$;
 (c) heating the suspension/metal surface combination of step (b) at a second temperature for a time sufficient to remove substantially all said solvents from the applied suspension to form a coated metal substrate;
 (d) heating said coated/metal substrate combination of step (c) at a third temperature for a time sufficient to degrade substantially all of said binders in said applied suspension;
 (e) heating the coated metal substrate combination of step (d) for a time and at a fourth temperature sufficient to sinter said glass/ceramic to form a predetermined pattern of sintered glass ceramic bonded to said surfaces of said metal substrate; and
 (f) heating treating said sintered glass ceramic at a fifth temperature for a time sufficient to recrystallize any residual glass in said sintered glass/ceramic.

49. An electronic substrate comprising:
 (a) a metal core;
 (b) a glass/ceramic coating in the form of a non-conductive layer having thickness ranging from about 0.020mm to about 0.100mm and comprising (on an oxide basis);
  (i) from about 8 to about 26% by weight of MgO based on the total weight of the coating;
  (ii) from about 10 to about 49% by weight of $Al_2O_3$ based on the total weight of the coating;
  (iii) from about 42 to about 68% by weight of $SiO_2$ based on the total weight of the coating;
  (iv) from about 1 to about 15% by weight, based on the total weight of MgO, $Al_2O_3$ and $SiO_2$ in the coating of boron oxide and one or more of alkali metal oxides alkaline earth metal oxides and since oxide; and
 (c) a layer of a conductive material heat bonded and sintered to all or a portion of the surfaces of said glass/ceramic coating; in a pre-determined pattern.

50. An electronic substrate according to claim 49 which further comprises a layer of resistive materials heated bond to said surfaces of said coating in a predetermined pattern forming a resistor between two or more circuit patterns.

51. An electronic substrate according to claim 49 which further comprises one or more capacitive elements said elements formed by overlapping circuit sandwhiching a layer of dielective material.

52. An electronic substrate according to claim 49 wherein said substrate forms a circuit board wherein said layer of a conductive material is what bonded and sintered to all or a portion of the surfaces of said glass/ceramic coating in a predetermined pattern defining an electrical circuit.

53. An electronic substrate according to claim 52 wherein said conductive material is a metal.

54. An electronic substrate according to claim 53 wherein said metal is an alloy of nickel or iron.

55. An electronic substrate according to claim 49 wherein said substrate forms a capacitive device.

* * * * *